(12) United States Patent
Tsuchihashi et al.

(10) Patent No.: US 6,273,023 B1
(45) Date of Patent: Aug. 14, 2001

(54) PLASMA PROCESSING APPARATUS CAPABLE OF RELIABLY, ELECTROSTATICALLY ATTRACTING AND HOLDING AND THUS FIXING SEMICONDUCTOR WAFER

(75) Inventors: Masaaki Tsuchihashi; Minoru Hanazaki, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/228,233

(22) Filed: Jan. 11, 1999

(30) Foreign Application Priority Data

Jul. 28, 1998 (JP) .................................................. 10-212700

(51) Int. Cl.[7] .............................. C23C 16/00; C23F 1/02
(52) U.S. Cl. ...................... 118/723 E; 156/345; 118/712
(58) Field of Search .................................. 118/712, 713, 118/714, 728, 723 R, 723 E, 723 ER; 156/345

(56) References Cited

U.S. PATENT DOCUMENTS

| | | | |
|---|---|---|---|
| 5,118,378 | * | 6/1992 | Moroi et al. .......................... 156/345 |
| 5,460,684 | * | 10/1995 | Saeki et al. ........................... 156/345 |
| 5,529,657 | * | 6/1996 | Ishii ...................................... 156/345 |
| 6,015,465 | * | 1/2000 | Kholodenko et al. ................ 118/719 |
| 6,041,734 | * | 3/2000 | Raoux et al. ....................... 118/723 E |
| 6,080,292 | * | 6/2000 | Matsuzawa et al. ............. 204/298.03 |
| 6,085,690 | * | 7/2000 | Mizuno ............................. 118/723 E |

FOREIGN PATENT DOCUMENTS 8-124913   5/1996   (JP) .

* cited by examiner

Primary Examiner—Gregory Mills
Assistant Examiner—Luz Alejandro
(74) Attorney, Agent, or Firm—McDermott, Will & Emery

(57) ABSTRACT

A plasma processing apparatus capable of attracting and holding a semiconductor wafer reliably once the processing of the semiconductor wafer is started includes: a vacuum chamber; an electrode arranged inside the vacuum chamber; a dielectric film formed on a surface of the electrode; a gas supply port leading to the vacuum chamber; a high-frequency electric power supply connected to the electrode; a memory operation unit which depends on a processing condition for producing a desired plasma, to calculate and output the voltage value corresponding to the sum of a value of a minimal actual attract and hold voltage required to be applied between one surface of the semiconductor wafer mounted on the dielectric film and a surface of the dielectric film to attract and hold one surface of the semiconductor wafer on the surface of the dielectric film and a value of a self-bias voltage generated at the other surface of the semiconductor wafer when the desired plasma is produced; and an electrostatic chuck power supply for applying the voltage corresponding to the voltage value calculated in the memory operation unit to the electrode. An electrostatic attract and hold vacuum chucking method employed in the plasma processing apparatus is also disclosed.

10 Claims, 13 Drawing Sheets

PLASMA PROCESSING APPARATUS CAPABLE OF RELIABLY, ELECTROSTATICALLY ATTRACTING AND HOLDING AND THUS FIXING SEMICONDUCTOR WAFER

BACKGROUND OF THE INVENTION

1. Field of the Invention

The present invention relates to plasma processing apparatuses and electrostatic attract-and-hold vacuum chucking methods employed therein, and in particular to plasma processing apparatuses electrostatically attracting and holding semiconductor wafers to fix the semiconductor wafers and electrostatic attract-and-hold vacuum chucking methods employed therein.

2. Description of the Background Art

In recent years, electrostatic chuck technology has been increasingly used for apparatuses which process semiconductor wafers as desired, such as plasma etching apparatuses, plasma film-forming apparatuses. Electrostatic chuck technology can prevent deposition of foreign matters at the perimeter of a semiconductor wafer that have been conventionally often produced at a wafer clamp clamping the perimeter of the semiconductor wafer. This ensures that the most outer peripheral portion of a semiconductor device fabricated on the semiconductor wafer can be provided as a product to increase yield. Electrostatic chuck technology is a technology that can be utilized for various semiconductor manufacturing apparatuses in the future.

Referring to FIG. 1, a conventional plasma processing apparatus 60 which employs electrostatic chuck technology includes a vacuum chamber 21 blocking the external atmosphere from the internal for maintaining the internal atmosphere.

Vacuum chamber 21 includes a lower electrode 24, a dielectric film 23 formed on a surface of lower electrode 24 to attract a semiconductor wafer 22 through electrostatic force, a gas supply port 25 for introducing a desired gas into vacuum chamber 21 from e.g. a gas cylinder (not shown), an upper electrode 26 arranged opposite to lower electrode 24 for diffusing the gas introduced via gas supply port 25 to introduce the gas into vacuum chamber 21 and also functioning as an electrode, an exhaust port 27 provided to exhaust the gas in the vacuum chamber 21 by means of a vacuum pump (not shown), and an insulator 33 formed on lower electrode 24 to maintain the insulation between lower electrode 24 and the gas in vacuum chamber 21.

Plasma processing apparatus 60 also includes an electrostatic chuck power supply 31 for applying a desired voltage to dielectric film 23 via lower electrode 24, a control signal unit 32 receiving a value of an electrostatic chuck voltage Vs (described hereinafter) stored in a processing-condition memory unit 62 described hereinafter to control a voltage output from electrostatic chuck power supply 31 and thus apply electrostatic chuck voltage Vs from electrostatic chuck power supply 31 to lower electrode 24, a high-frequency power supply 29 for applying high-frequency electric power to lower electrode 24, a high-frequency cutting filter 30 provided to prevent the high-frequency electric power from sneaking from high-frequency power supply 29, and a matching transformer 28 for achieving the matching/integrity between high-frequency power supply 29 and lower electrode 24.

A desired gas introduced into vacuum chamber 21 is electromagnetized by high-frequency power supply 29 to produce a plasma 34.

Plasma processing apparatus 60 also includes a processing-condition memory unit 62 for storing the conditions for producing plasma 34 desired, such as gas flow, the pressure in vacuum chamber 21, the magnitude of high-frequency electric power (referred to as "processing conditions" hereinafter), and the voltage applied from electrostatic chuck power supply 31 to lower electrode 24, or electrostatic chuck voltage Vs.

A plasma 34 producing operation effected in plasma processing apparatus 60 will now be described briefly and electrostatic attract-and-hold vacuum chuck operation will then be described.

Plasma Producing Operation

Semiconductor wafer 22 is transported into vacuum chamber 21 via a transport device (not shown) and mounted on lower electrode 24 with dielectric film 23 interposed therebetween. Depending on the processing conditions stored in processing-condition memory unit 62, a predetermined amount of gas is introduced from gas supply port 25 via upper electrode 26 into vacuum chamber 21. Simultaneously, a predetermined amount of gas is exhausted from exhaust port 27. Thus, the pressure inside vacuum chamber 21 is adjusted to have the value of a pressure determined by the processing conditions. Then, high-frequency power supply 29 applies high-frequency electric power to lower electrode 24 via matching transformer 28. Associated with the application of high-frequency electric power, plasma 34 is produced inside vacuum chamber 21. Then, desired processes, such as etching, film-forming, are applied to semiconductor wafer 22.

Electrostatic Attract-and-Hold Vacuum Chucking Operation

When semiconductor wafer 22 is mounted on dielectric film 23 and plasma 34 is produced in vacuum chamber 21, an equivalent circuit, such as shown in FIG. 2, is formed.

The equivalent circuit shown in FIG. 2 includes electrostatic chuck power supply 31 having one end connected to the ground and the other end connected to lower electrode 24 for applying electrostatic chuck voltage Vs to lower electrode 24, dielectric film 23 formed on lower electrode 24, semiconductor wafer 22 mounted on dielectric film 23, and an equivalent plasma resistance 70 having one end connected to semiconductor wafer 22 and the other end connected to the ground, and formed of plasma 34.

When electrostatic chuck power supply 31 applies negative (−) direct current voltage to lower electrode 24, positive (+) and negative (−) electric charges are induced at an interface between lower electrode 24 and dielectric film 23 and between dielectric film 23 and semiconductor wafer 22. As a result, the attraction referred to as Coulomb force or Johnsen-Rahbeck force is caused between semiconductor wafer 22 and dielectric film 23 and semiconductor wafer 22 is thus attracted onto dielectric film 23. Thus, conventional plasma process apparatus 60 can reliably attract semiconductor wafer 22 onto dielectric film 23 when the characteristics of plasma 34 formed are constant.

In plasma processing apparatus 60, the difference between the electron current and iron current that flow onto semiconductor wafer 22 causes a self-bias voltage Vdc. The value of self-bias voltage Vdc varies depending on the condition of plasma 34.

Referring to FIG. 3, the relation represented as equation (1) is established between self-bias voltage Vdc, a voltage V1 caused between semiconductor wafer 22 and dielectric film 23, and electrostatic chuck voltage Vs:

$$Vs = V1 + Vdc \quad (1)$$

As has been mentioned above, the value of self-bias voltage Vdc varies depending on the condition of plasma 34.

In conventional plasma processing apparatus 60, however, the value of electrostatic chuck voltage Vs is fixed. Accordingly, for conventional plasma processing apparatus 60, the value of voltage V1 decreases as the value of self-bias voltage Vdc increases. Thus, the force to attract and hold semiconductor wafer 22 is reduced this disadvantageously.

FIG. 4 shows respective experiment results of a self-bias voltage Vdc and a minimal voltage Vmin required to attract and thus hold wafer 22 of 8"φ on dielectric film 23 when the high-frequency electric power output from high-frequency power supply 29 is varied. Minimal voltage Vmin is a voltage applied from electrostatic chuck power supply 31 to lower electrode 24 to attract and hold semiconductor wafer 22 on dielectric film 23. The graph shows that as that self-bias voltage Vdc has a more negative value, minimal voltage Vmin also has a more negative value. For example, when electrostatic chuck voltage Vs is set at −450V, it is understood that semiconductor wafer 22 can be attracted and held for a high-frequency electric power of no more than 400 W whereas semiconductor wafer 22 cannot be attracted or held for a high-frequency electric power of 500 W. It is thus understood that determining the value of electrostatic chuck voltage Vs depending on self-bias voltage Vdc is important in stabilizing the force to attract and hold semiconductor wafer 22.

For a plasma processing apparatus disclosed in Japanese Patent Laying-Open No. 8-124913, a computer is employed to observe self-bias voltage Vdc. Depending on the value of self-bias voltage Vdc observed, the value of electrostatic chuck voltage Vs is corrected and thus applied to an electrode to stabilize the force to attract and hold a semiconductor wafer.

There is a time delay caused, however, in observing self-bias voltage Vdc and then feeding the observed value back to electrostatic chuck voltage Vs. Furthermore, the value of self-bias voltage Vdc varies from time to time, since the plasma is not stable at the start of process.

Thus, electrostatic chuck voltage Vs corrected can fail to provide the voltage sufficient to attract and hold a semiconductor wafer. This results in a disadvantage that the force to attract and hold the semiconductor wafer is not stabilized.

SUMMARY OF THE INVENTION

The present invention has been made to overcome the disadvantages described above.

One object of the present invention is to provide a plasma processing apparatus capable of reliably attracting and holding a semiconductor wafer once a semiconductor wafer process is started, and an electrostatic attract-and-hold vacuum chucking method employed in the plasma processing apparatus.

Another object of the present invention is to provide a plasma processing apparatus wherein simply inputting process conditions allows the same to reliably attract and hold a semiconductor wafer once the processing of the semiconductor wafer is started, and an electrostatic attract-and-hold vacuum chucking method employed for the same.

A plasma processing apparatus in one aspect of the present invention includes a vacuum chamber blocking the external atmosphere from the interior thereof for maintaining the atmosphere therein, an electrode arranged in the vacuum chamber, a dielectric film formed on a surface of the electrode, a gas supply port for supplying a desired gas into the vacuum chamber, a plasma production unit for allowing a gas to change into a plasma, a memory operation unit for calculating and outputting depending on a process condition for producing a desired plasma the voltage value equal to the sum of the value of the actual minimal attract and hold voltage required to be applied between one surface of a semiconductor wafer mounted on the dielectric film and a surface of the dielectric film to attract and hold one surface of the semiconductor wafer on the surface of the dielectric film and the value of a self-bias voltage generated at the other surface of the semiconductor wafer when the desired plasma is produced, and an electrostatic chuck power supply for applying the voltage corresponding to the voltage value calculated in the memory operation unit to the electrode.

Since the voltage corresponding to the value of an actual attract and hold voltage plus the value of a plasma-generated, self-bias voltage is applied to the electrode, the value of the voltage generated between one surface of the semiconductor wafer and the dielectric film can be equal to the value of the actual attract and hold voltage. Thus, once the processing of the semiconductor wafer is started, the semiconductor wafer is kept attracted and thus held reliably on a surface of the dielectric film.

Preferably, the memory operation unit includes a circuit for storing the relation between a processing condition and the value of a self-bias voltage, externally receiving a processing condition and the value of an actual attract and hold voltage, calculating the value of a self-bias voltage depending on the externally input processing condition, and adding the calculated value of the self-bias voltage to the actual attract and hold voltage for output.

The relation between a processing condition and the value of a self-bias voltage are stored previously. The value of a self-bias voltage calculated depending on a processing condition externally input is add to the value of an actual attract and hold voltage externally input. The voltage corresponding to the value resulting from the summation is applied to the electrode. Thus, simply entering a processing condition and the value of an actual attract and hold voltage from the external allows a semiconductor wafer to be attracted and held on a surface of the dielectric film reliably once stably the processing of the semiconductor wafer is started.

Still preferably, the memory operation unit includes a circuit for storing the relation between a processing condition, and the value of a self-bias voltage and the value of an actual attract and hold voltage, externally receiving a processing condition, calculating the value of a self-bias voltage and the value of an actual attract and hold voltage depending on the processing condition externally input, and adding the both values together for output.

The relation of a processing condition, and the value of a self-bias voltage and the value of an actual attract and hold voltage is stored previously. Depending on an externally input processing condition, the value of a self-bias voltage and the value an actual attract and hold voltage are calculated and the value corresponding to the summation of the both values is applied to the electrode. Thus, simply entering a processing condition form the external allows a semiconductor wafer to be attracted and thus held on a surface of the dielectric film reliably once the processing of the semiconductor wafer is started.

Still preferably, the plasma processing apparatus also includes a measuring instrument for measuring and outputting to the self-bias voltage, and the memory operation unit includes a determination unit connected to the measuring instrument for determining whether the value of the self-bias voltage is stable, a memory device for storing the relation between a processing condition and the value of a self-bias voltage, and a circuit connected to the measuring instrument, the determination unit and the memory device, responsive to an output from the determination unit for selecting one of the self-bias voltage determined by the processing condition and the self-bias voltage measured by the measuring instrument and adding the selected self-bias voltage to an actual attract and hold voltage input externally or stored in the memory device for output.

The relation between a processing condition and the value of a self-bias voltage is stored previously. The measuring instrument measures the value of a self-bias voltage. If it has been determined depending on the measurement that the value of the self-bias voltage is not stable at e.g. the initiation of a process, the value of a self-bias voltage is calculated depending on a processing condition externally input. The value of the self-bias voltage calculated and the value of an actual attract and hold voltage externally input are added together. The voltage corresponding to the value obtained from the summation is applied to the electrode. When determination is made that the value of a self-bias voltage is stabilized, the value of the self-bias voltage actually measured and that of an actual attract and hold voltage externally input are added together. The voltage corresponding to the value obtained from the summation is applied to the electrode. Thus, if the value of a self-bias voltage is not stable at e.g. the initiation of a processing, the value of a self-bias voltage previously stored is used to determine the value of a voltage applied to the electrode. If the value of a self-bias voltage is stable, the value of the self-bias voltage actually measured is used to determine the value of a voltage applied to the electrode. Thus, a semiconductor wafer can be attracted and thus held precisely on a surface of the dielectric film reliably once the processing of the semiconductor wafer is started.

A plasma processing apparatus in another aspect of the present invention includes a vacuum chamber, an electrode arranged inside the vacuum chamber, a dielectric film formed on a surface of the electrode, a gas supply port leading to the vacuum chamber, a high-frequency power supply connected to the electrode, a memory operation unit calculating depending on a processing condition for producing a desired plasma the value of the voltage corresponding to the summation of the value of a minimal actual attract and hold voltage required to be applied between one surface of a semiconductor wafer mounted on the dielectric film and a surface of the dielectric film to attract and thus keep one surface of the semiconductor wafer held on the surface of the dielectric film the value of a self-bias generated at the other surface of a semiconductor wafer when the desired plasma is produced and outputting the calculated voltage value, and an electrostatic chuck power supply for applying the voltage corresponding to the voltage value calculated in the memory operation unit to the electrode.

Since the voltage corresponding to the value of an actual attract and hold voltage plus that of a plasma-generated, self-bias voltage is applied to the electrode, the value of the voltage generated between one surface of a semiconductor wafer and the dielectric film can be equal to the value of the actual attract and hold voltage. Thus, once the processing of the semiconductor wafer is started, the semiconductor wafer can be attracted and held reliably on a surface of the dielectric film.

An electrostatic attract and hold vacuum chucking method in still another aspect of the present invention is employed in a plasma processing apparatus including a vacuum chamber blocking the external atmosphere from the interior thereof for maintaining the atmosphere therein, an electrode arranged inside the vacuum chamber, a dielectric film formed on a surface of the electrode, a gas supply port for supplying a desired gas into the vacuum chamber, a plasma producing unit for changing a gas into a plasma, a memory operation unit for calculating depending on a processing condition for producing a desired plasma the value of the voltage corresponding to the sum of the value of a minimal actual attract and hold voltage required to be applied between one surface of a semiconductor wafer mounted on the dielectric film and a surface of the dielectric film to attract and thus keep one surface of the semiconductor wafer held on the surface of the dielectric film and the value of a self-bias voltage generated at the other surface of the semiconductor wafer when the desired plasma is produced and outputting the calculated voltage value, and an electrostatic chuck power supply for applying the voltage corresponding to the voltage value calculated in the memory operation unit to the electrode. The electrostatic attract-and-hold vacuum chucking method includes the step of externally receiving a processing condition for producing a desired plasma, and the step of calculating, depending on the processing condition, the value of the voltage corresponding to the summation of the value of a minimal actual attract and hold voltage required to be applied between one surface of a semiconductor wafer mounted on the dielectric film and a surface of the dielectric film to attract and thus keep one surface of the semiconductor wafer held on the surface of the dielectric film and the value of a self-bias voltage generated at the other surface of the semiconductor wafer when the desired a plasma is produced and of providing the calculated voltage value to the electrostatic chuck power supply.

Since the voltage corresponding to the value of an actual attract and hold voltage plus the value of a plasma-generated, self-bias voltage is applied to the electrode, the value of the voltage generated between one surface of the semiconductor wafer and the dielectric film can be equal to the value of the actual attract and hold voltage. Thus, the semiconductor wafer can be attract and thus held on a surface of the dielectric film reliably once the processing of the semiconductor wafer is started.

Preferably, the memory operation unit includes a circuit for storing the relation between a processing condition and the value of a self-bias voltage, receiving a processing condition and the value of an actual attract and hold voltage from respective externals, calculating the value of a self-bias voltage depending on the externally input processing condition, adding the calculated value of the self-bias voltage to the value of the actual attract and hold voltage together for output. The step of calculating and provided includes the step of externally receiving the value of an actual attract and hold voltage, the step of calculating the value of a self-bias voltage depending on a processing condition, and the step of adding the value of the actual attract and hold voltage to the value of the self-bias voltage and applying the value of obtained from the summation to the electrostatic chuck power supply.

The relation between a processing condition and the value of a self-bias voltage is stored previously. The value of a self-bias voltage calculated depending on a processing condition externally input is added to the value of an actual attract and hold voltage externally input. The voltage corresponding to the value resulting from the summation is applied to the electrode. Thus, simply entering a processing condition and the value of an actual attract and hold voltage from the external allows a semiconductor wafer to be attracted and thus held on a surface of the dielectric film reliably once the processing of the semiconductor wafer is started.

Still preferably, the memory operation unit includes a circuit for storing the relation between a processing condition, and the value of a self-bias voltage and the value of an actual attract and hold voltage, externally receiving a processing condition, calculating the value of a self-bias voltage and the value of an actual attract and hold voltage depending on an externally input processing condition, and adding the both values together for output. The step of calculating and providing includes the step of calculating the value of a self-bias voltage and the value of an actual attract and hold voltage depending on a processing condition and the step of adding the value the self-bias voltage and the value of the actual attract and hold voltage together and applying the value obtained from the summation to the electrostatic chuck power supply.

The relation between a processing condition, and the value of a self-bias voltage and the value of an actual attract and hold voltage is stored previously. The value of a self-bias voltage and the value of an actual attract and hold voltage are calculated depending on a processing condition externally input, and the voltage corresponding to the value obtained from adding the both values together is applied to the electrode. Thus, simply entering a processing condition from the external allows a semiconductor wafer to be attracted and thus held on a surface of the dielectric film reliably once the processing of the semiconductor wafer is started.

Still preferably, the plasma processing apparatus also includes a measuring instrument for measuring and outputting a self-bias voltage, and the memory operation unit includes a determination unit connected to the measuring instrument for determining whether the value of a self-bias voltage is stable, a memory device for storing the relation between a processing condition and the value of a self-bias voltage, and a circuit connected to the measuring instrument, the determination unit and the memory device, responsive to an output from the determination unit for selecting one of a self-bias voltage determined by a processing condition and a self-bias voltage measured by the measuring instrument and adding the selected self-bias voltage to an actual attract and hold voltage externally input for output. The step of calculating and providing includes the step of externally receiving the value of and an actual attract and hold voltage, the step of determining whether the value of a self-bias voltage output from the measuring instrument is stable, the step of calculating a self-bias voltage depending on a processing condition and providing to the electrostatic chuck power supply the value corresponding to the summation of the calculated self-bias voltage and an actual attract and hold voltage externally input or stored in the memory device if the value of the measured self-bias voltage is not stable, and the step of providing to the electrostatic chuck power supply the value corresponding to the summation of a self-bias voltage measured with the measuring instrument and an actual attract and hold voltage input externally or stored in the memory device if the value of the measured self-bias voltage is stable.

The relation between a processing condition and the value of a self-bias voltage is stored previously. The measuring instrument measures the value of a self-bias voltage. When determination is made depending on the measurement that the value of the self-bias voltage is not stable at e.g. the initiation of a processing, the value of a self-bias voltage is calculated depending on a processing condition externally input. The calculated value of the self-bias voltage is added to the value of an actual attract and hold voltage externally input. The voltage corresponding to the value resulting from the summation is applied to the electrode. If determination is made that the value of a self-bias voltage is stable, the value of the self-bias voltage actually measured is added to the value of an actual attract and hold voltage externally input. The voltage corresponding to the value resulting from the summation is applied to the electrode. Thus, if the value of a self-bias voltage is not stable at e.g. the initiation of a processing, the value of a self-bias voltage previously stored is used to determine the value of a voltage applied to the electrode. If the value of a self-bias voltage is stable, the value of the self-bias voltage actually measured is used to determine the value of a voltage applied to the electrode. Thus, a semiconductor wafer can be attracted and thus held precisely on a surface of the dielectric film reliably once the processing of the semiconductor wafer is started.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
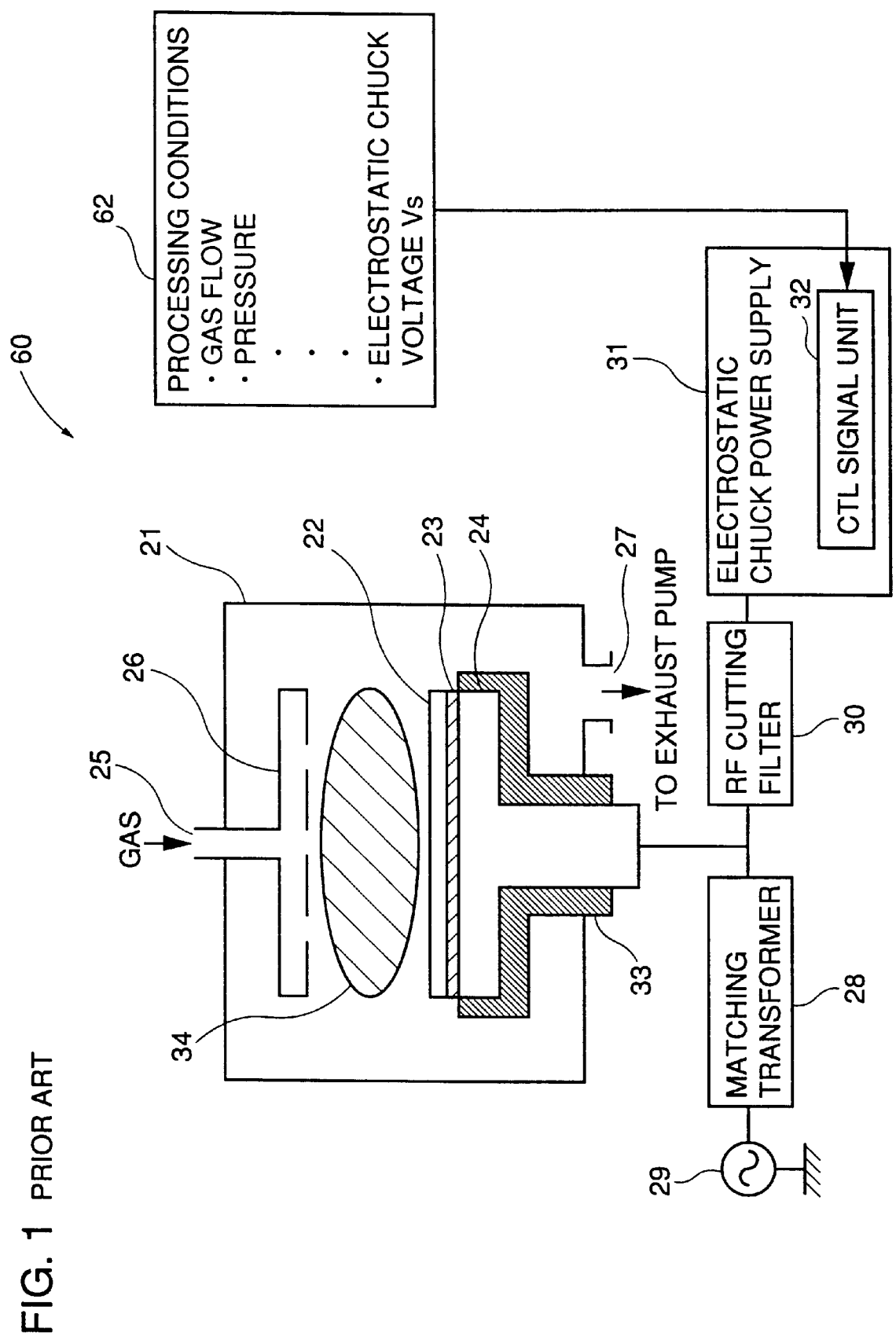
FIG. 1 shows a structure of a conventional plasma processing apparatus.
Figure 2:
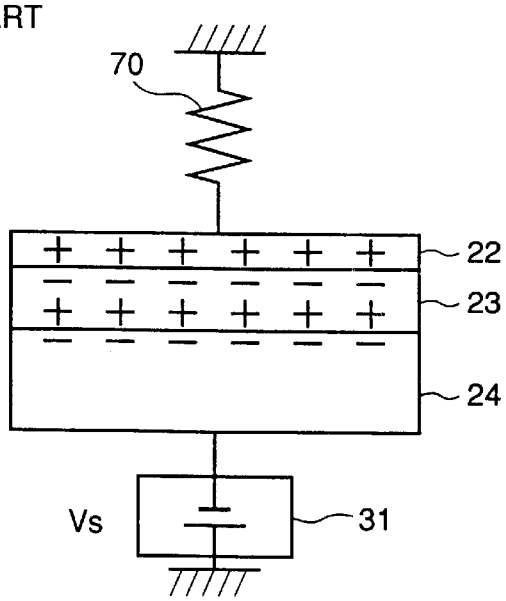
FIG. 2 shows an equivalent circuit formed in vacuum chamber 21 when plasma 34 is produced.
Figure 3:
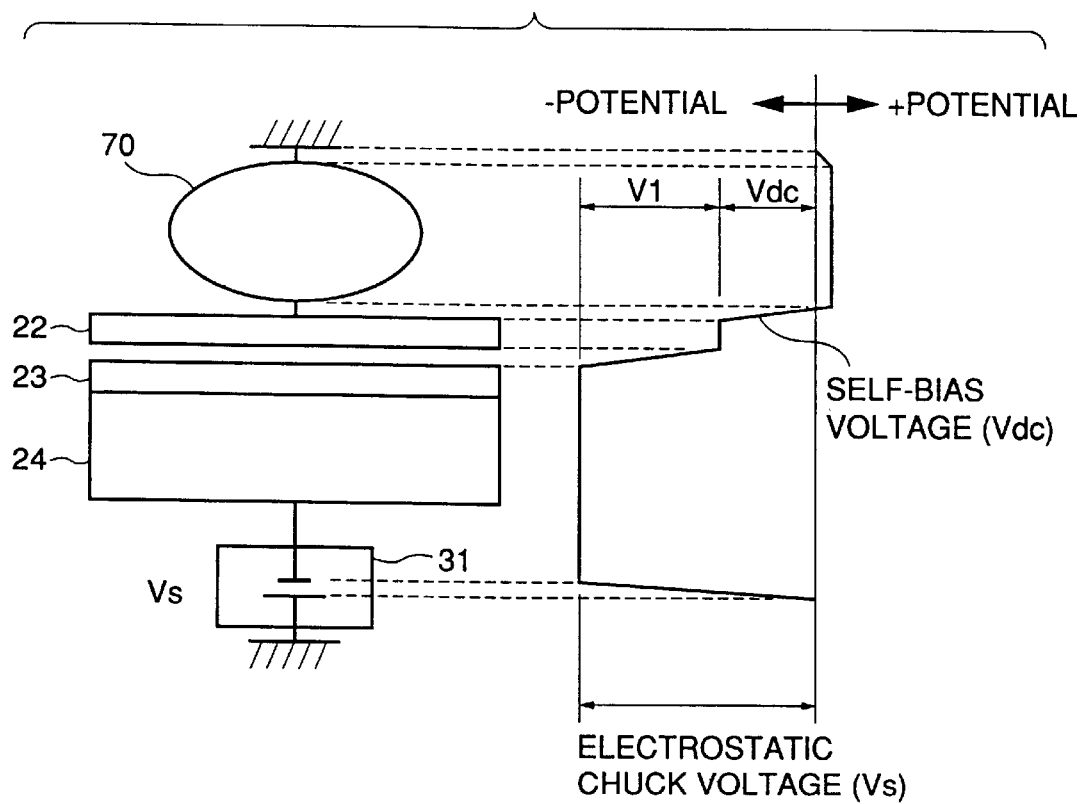
FIG. 3 shows a relation between self-bias voltage Vdc, voltage V1 generated between a semiconductor wafer and the dielectric film, and electrostatic chuck voltage Vs.

Hereinafter, a plasma processing apparatus according to a first embodiment of the present invention will be described with reference to the drawings. It should be noted that in the description provided hereinafter, identical portions are denoted by the same reference characters. The name and function thereof are also identical and a description thereof will not be repeated, as appropriate.

Figure 5:
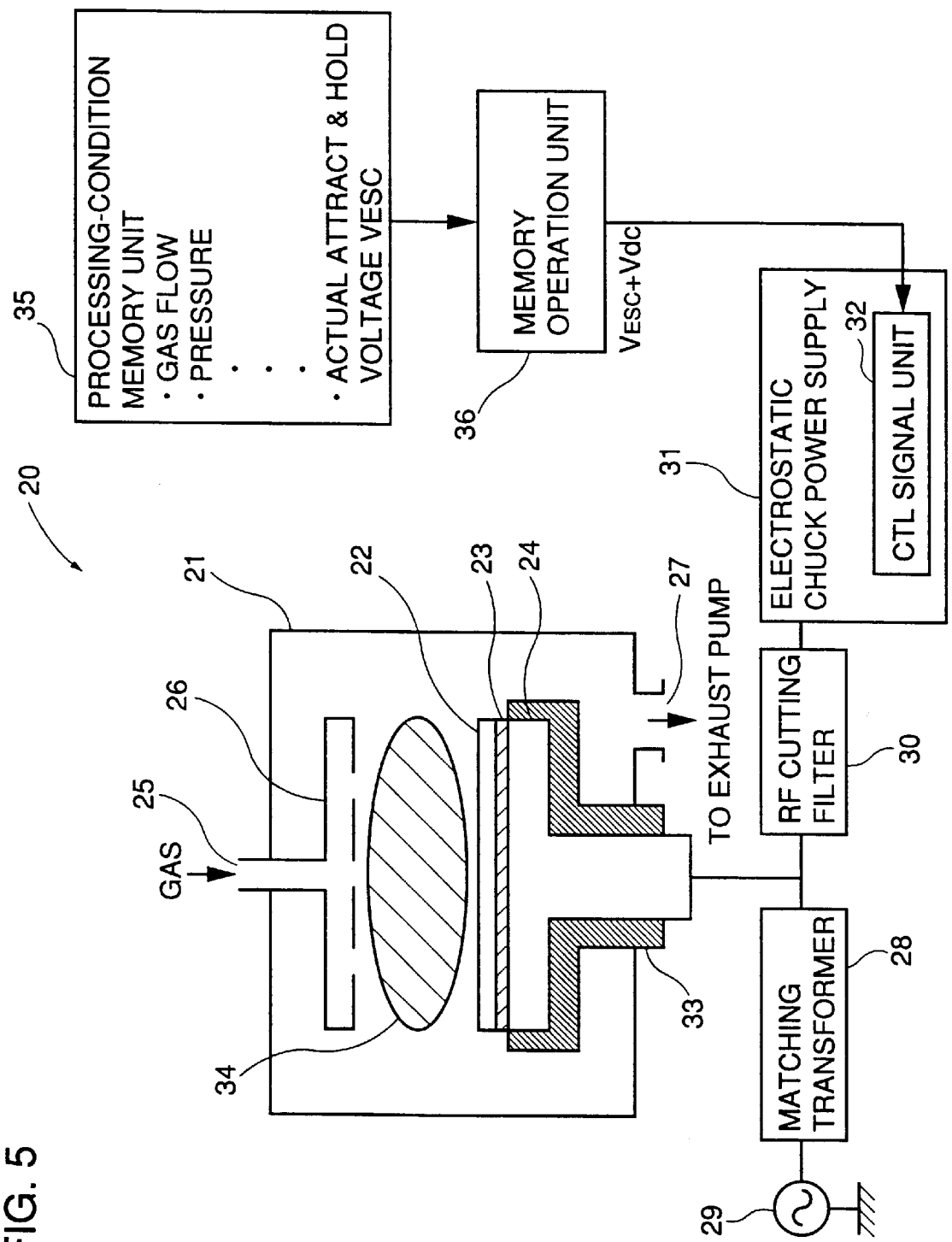
FIG. 5 is a block diagram showing a configuration of a plasma processing apparatus according to a first embodiment of the present invention.

Referring to FIG. 5, a plasma processing apparatus 20 according to the first embodiment includes a vacuum chamber blocking the external atmosphere from the interior thereof for maintaining the atmosphere therein.

Vacuum chamber 21 includes a lower electrode 24, a dielectric film 23 formed on a surface of lower electrode 24 to attract and keep a semiconductor wafer 22 held thereon through electrostatic force, a gas supply port 25 for introducing a desired gas from e.g. a gas cylinder (not shown) into vacuum chamber 21, an upper electrode 26 arranged opposite to lower electrode 24 for diffusing the gas introduced via gas supply port 25 to introduce the diffused gas into vacuum chamber 21 and also serving as an electrode, an exhaust port 27 provided to exhaust the gas inside the vacuum chamber by means of a vacuum pump (not shown), and an insulator 33 formed on lower electrode 24 to maintain the insulation between lower electrode 24 and the gas inside vacuum chamber 21.

Plasma processing apparatus 20 also includes an electrostatic chuck power supply 31 for applying a desired voltage to dielectric film 23 via lower electrode 24, a control signal unit 32 provided to control an output voltage from electrostatic chuck power supply 31 and apply an electrostatic chuck voltage Vs from electrostatic chuck power supply 31 to lower electrode 24, a high-frequency power supply 29 provided to apply high-frequency electric power to lower electrode 24, a high-frequency cutting fielder 30 provided to prevent high-frequency electric power from sneaking from high-frequency power supply 29, and a matching transformer 28 provided to achieve the matching between high-frequency power supply 29 and lower electrode 24.

A desired gas introduced into vacuum chamber 21 is electro-magnetized by high-frequency power supply 29 to produce a plasma 34. The operation of producing plasma 34 is similar to that associated with the background art described hereinbefore and a description thereof will thus not be repeated.

Plasma processing apparatus 20 also includes a processing-condition memory unit 35 for storing the conditions for producing plasma 34 as desired, such as gas flow, the pressure inside vacuum chamber 21, the magnitude of high-frequency electric power (referred to as "processing conditions" hereinafter), and an actual attract and hold voltage VESC corresponding to the voltage required for attracting and keeping semiconductor wafer 22 held on dielectric film 23, and a memory operation unit 36 for calculating the value of the voltage applied from electrostatic chuck power supply 32 to lower electrode 24 depending on the processing conditions and actual attract and hold voltage VESC stored in processing-condition memory unit 35.

Figure 6:
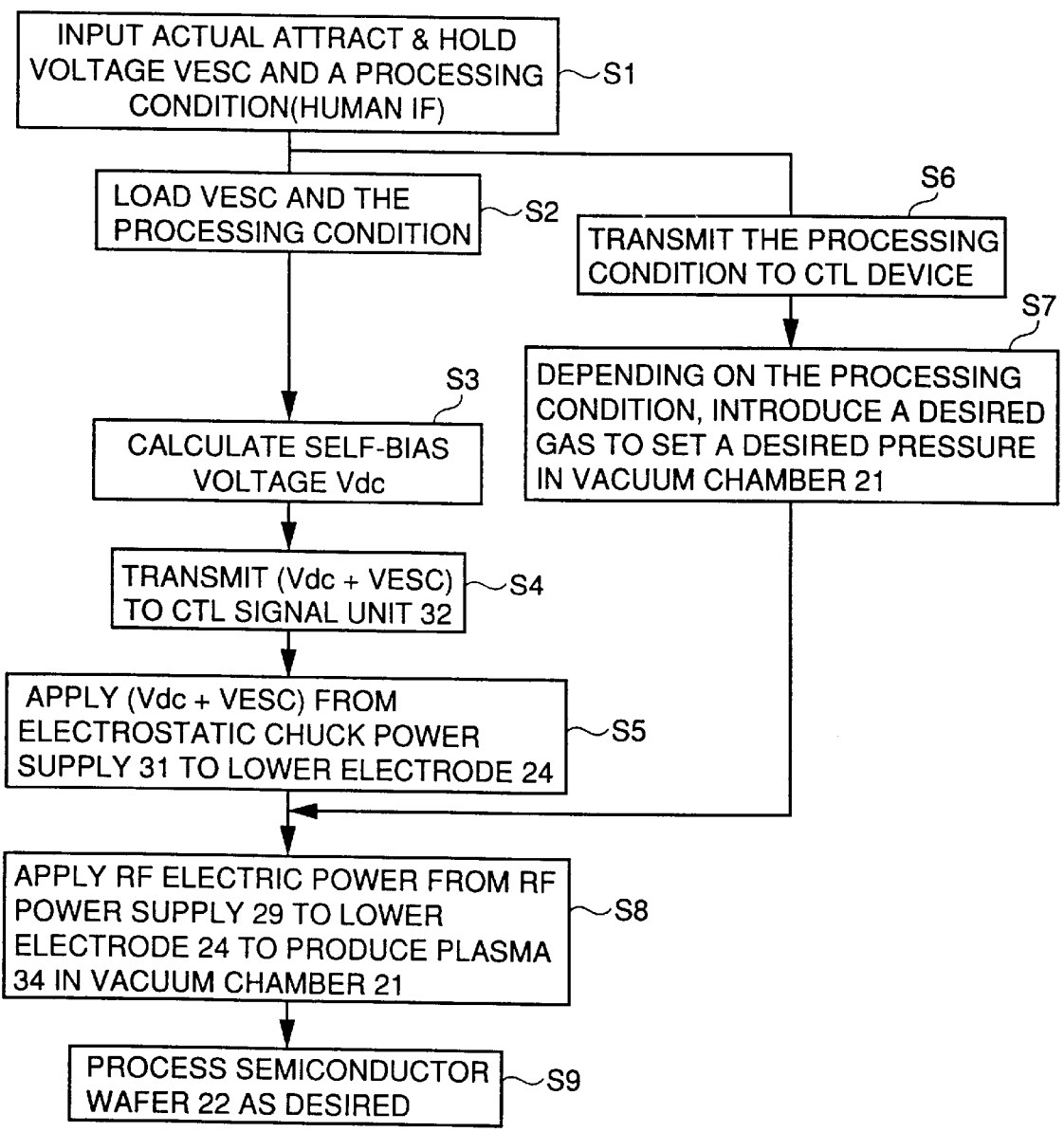
FIG. 6 is a flow chart representing an operation of the plasma processing apparatus according to the first embodiment.

Referring to FIG. 6, the various portions of plasma processing apparatus 20 operate as described below. Initially, the user inputs a processing condition and actual attract and hold voltage VESC via an input portion (not shown) (S1). The input processing condition and actual attract and hold voltage VESC are stored in processing-condition memory unit 35. The processing condition stored in processing-condition memory unit 35 is transmitted to a control device (not shown) of vacuum chamber 21 (S6). Depending on the transmitted processing condition, the control device introduces a desired gas into vacuum chamber 21 to set a desired pressure in vacuum chamber 21 (S7).

In parallel with the steps of S6 and S7, the steps from S2 to S5 are provided as described below. Memory operation unit 36 is loaded with the processing condition and actual attract and hold voltage VESC stored in processing-condition memory unit 35 (S2). Memory operation unit 36 compares the loaded processing condition with the internal data stored in memory operation unit 36 and calculates self-bias voltage Vdc generated at a surface of semiconductor wafer 22 (S3). The process of calculation of self-bias voltage Vdc will be described hereinafter. Memory operation unit 36 adds self-bias voltage Vdc and actual attract and hold voltage VESC together and transmits the value obtained from the summation to control signal unit 32 provided in electrostatic chuck power supply 31 (S4). According to an instruction from control signal unit 32, the voltage corresponding to a magnitude of (Vdc+VESC) is applied from electrostatic chuck power supply 31 to lower electrode 24 (S5). The process provided so far allows semiconductor wafer 22 to be attracted and held on dielectric film 23. The reason why electrostatic chuck power supply 31 applies the voltage corresponding to the magnitude of (Vdc+VESC) to lower electrode 24 will be described hereinafter.

Then, high-frequency power supply 29 applies high-frequency electric power to lower electrode 24. Thus, plasma 34 is produced in vacuum chamber 21 (S8). Then, semiconductor wafer 22 is processed as desired to form a semiconductor device on semiconductor wafer 22 (S9).

Figure 4:
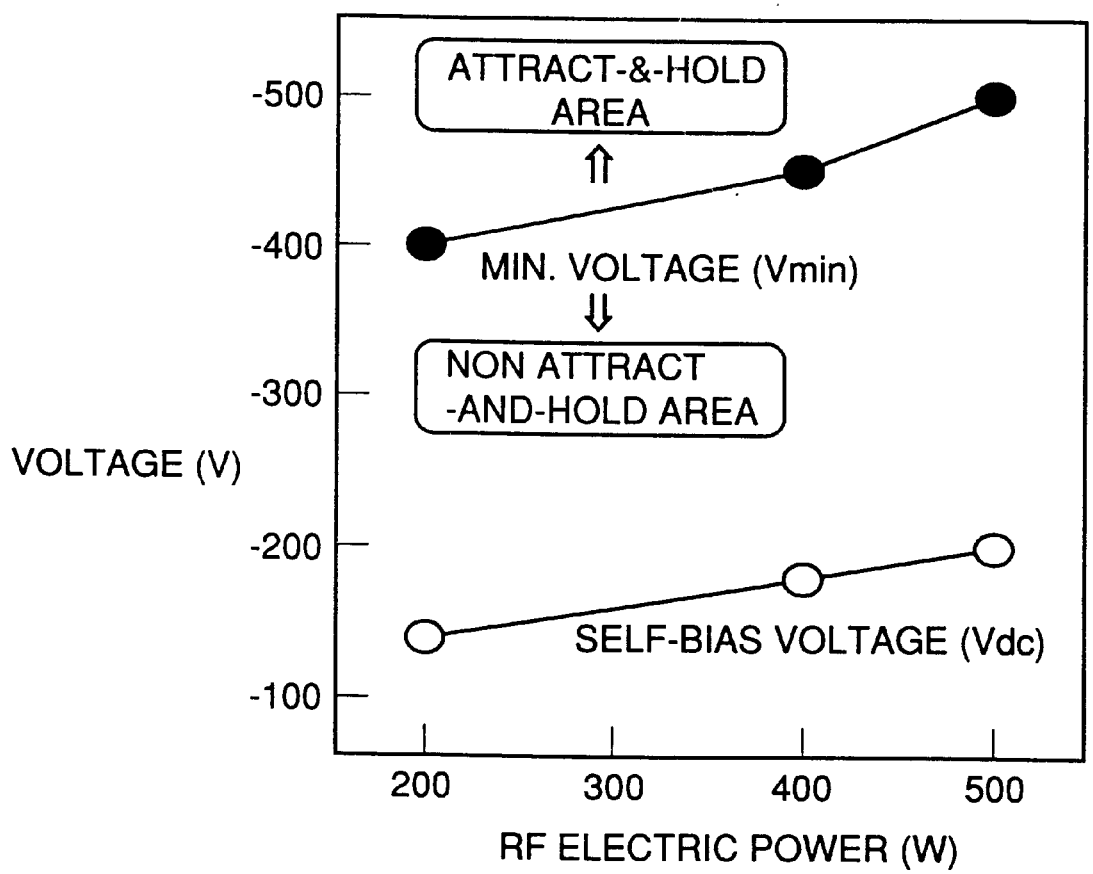
FIG. 4 represents a relation between high-frequency electric power and self-bias voltage Vdc and a relation between high-frequency electric power and a minimal voltage to be applied to an electrode so as to attract and keep a semiconductor wafer held.

The reason why electrostatic chuck power supply 31 applies the voltage corresponding to the magnitude of (Vdc+VESC) to lower electrode 24 will now be described with reference to FIG. 7. As has been described hereinbefore, there are the relations as shown in FIG. 4 between self-bias voltage Vdc and the high-frequency electric power applied from high-frequency power supply 29 to lower electrode 24 and between an electrostatic chuck power supply or minimal voltage Vmin required to be applied from electrostatic chuck power supply 32 to lower electrode 24 to attract and hold semiconductor wafer 22 and the high-frequency electric power applied from high-frequency power supply 29 to lower electrode 24, respectively.

Figure 7:
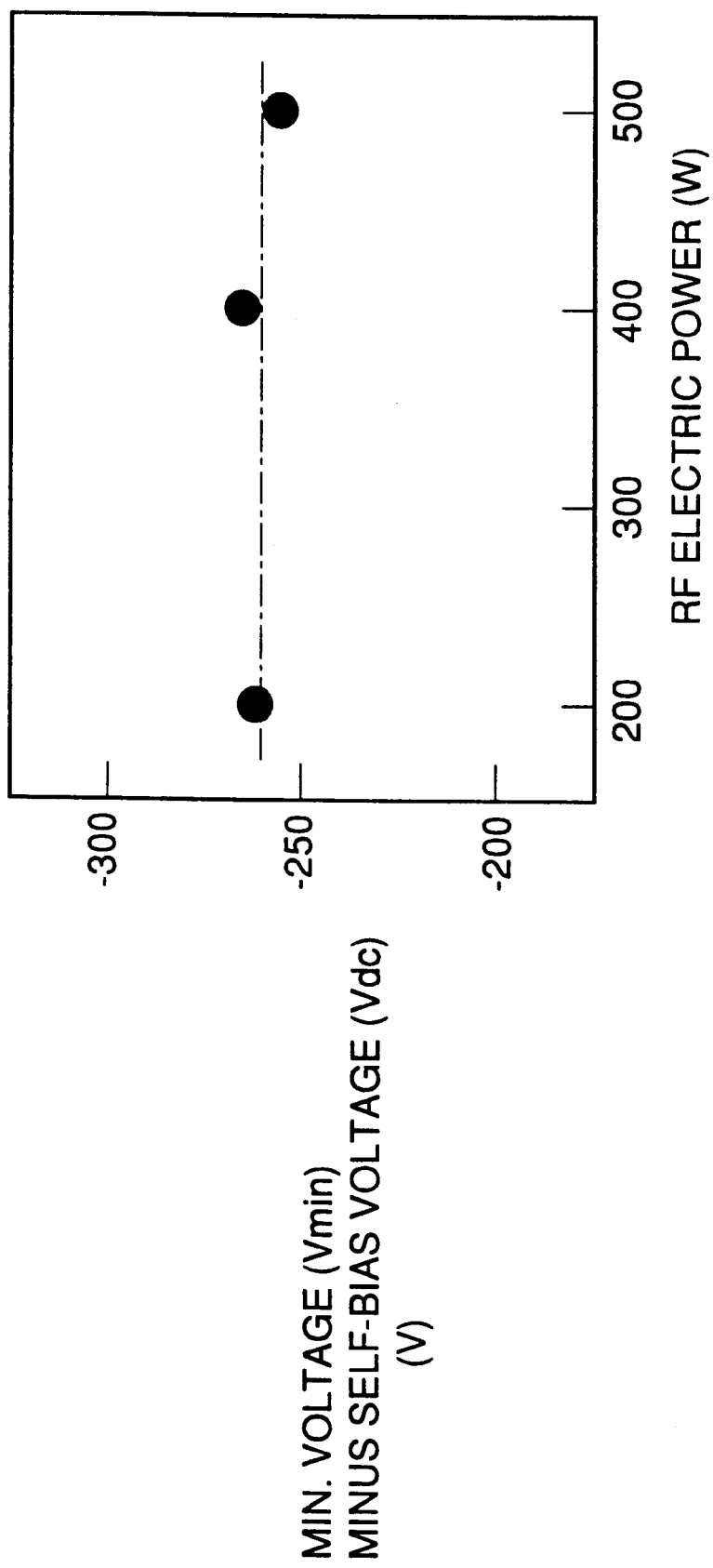
FIG. 7 represents a relation between high-frequency electric power and an actual attract and hold voltage VESC.

According to the relations, the relation as shown in FIG. 7 is obtained between minimal value Vmin minus self-bias voltage Vdc (Vmin−Vdc) and the high-frequency electric power. That is, the value of (Vmin−Vdc) is fixed regardless of the value of the high-frequency electric power. This value corresponds to actual attract and hold voltage VESC. Thus, the relation as represented by expression (2) is established:

$$VESC = Vmin - Vdc \tag{2}$$

From equation (2), equation (3) is derived:

$$Vmin = VESC + Vdc \tag{3}$$

Thus, the voltage corresponding to the magnitude of (VESC+Vdc) applied from electrostatic chuck power supply 32 to lower electrode 24 allows semiconductor wafer 22 to be attract and held reliably on lower electrode 24.

The S3 process in FIG. 6, i.e. how memory operation unit 36 calculates self-bias voltage Vdc, will now be more specifically described with reference to FIG. 8.

Figure 8:
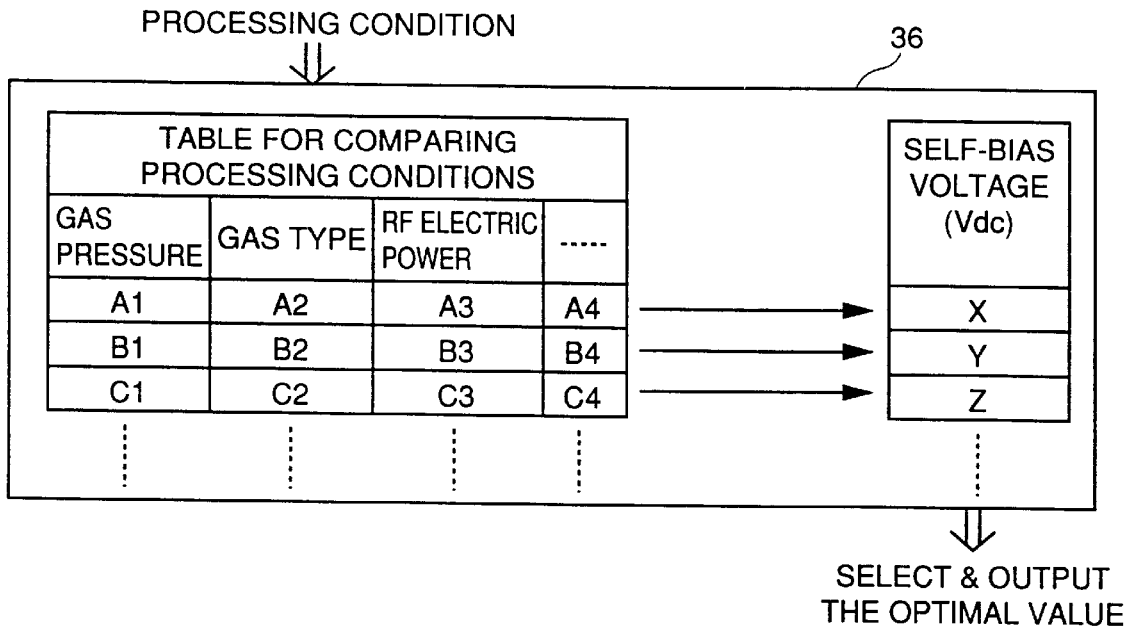
FIG. 8 illustrates a process for obtaining self-bias voltage Vdc.

Memory operation unit 36 stores the table as shown in FIG. 8 for comparing processing conditions. The table for comparing processing conditions represents a relation between a processing condition and self-bias voltage Vdc that has been obtained experimentally.

For example, when gas pressure, gas type and high-frequency electric power are provided as processing conditions A1, A2 and A3, respectively, these values are compared with the values presented in the table for comparing processing conditions and the value of self-bias voltage Vdc is obtained as X.

If the self-bias voltage corresponding to a processing condition is not stored in the table for comparing processing conditions, memory operation unit 36 calculates a self-bias voltage depending on the two processing conditions closest to the processing condition and the respective self-bias voltages corresponding to the two processing conditions. The self-bias voltage is calculated through a linear interpolation process.

Figure 9:
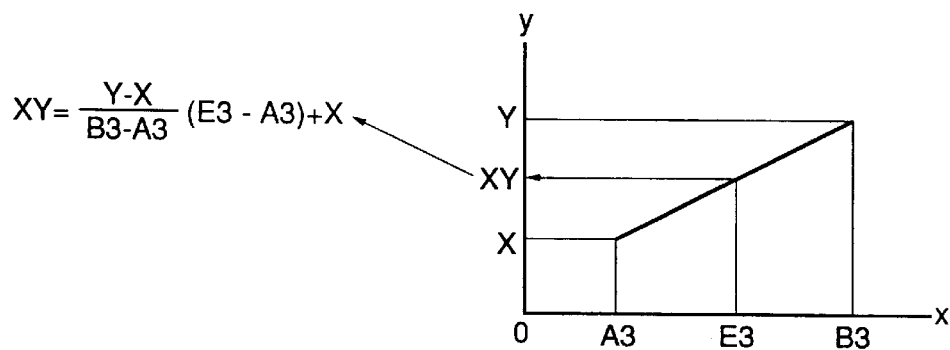
FIG. 9 represents a one-dimensional, linear interpolation process.

The linear interpolation process in one dimension will now be described with reference to FIG. 9. Let us now assume that the high-frequency electric power applied has a value E3 which is larger than A3 and smaller than B3. Since self-bias voltage Vdc has a value of X for high-frequency electric power A3 and a value of Y for high-frequency electric power B3, a value XY of self-bias voltage Vdc for high-frequency electric power E3 is represented by equation (4):

$$XY = \frac{Y - X}{B3 - A3}(E3 - A3) + X \tag{4}$$

That is, XY is obtained as the value for the y coordinate when the value for the x coordinate is E3 in the two-dimensional straight line passing coordinates (A3, X) and (B3, Y).

Thus, plasma processing apparatus 20 according to the first embodiment applies the voltage corresponding to the value of actual attract and hold voltage VESC plus the value of self-bias voltage Vdc determined by a processing condition to lower electrode 24. Thus, the voltage generated between dielectric film 23 and semiconductor wafer 22 has the same value as actual attract and hold voltage VESC. Thus, semiconductor wafer 22 is attracted and held reliably on the dielectric film 23. While a one-dimensional linear interpolation process is employed for calculating self-bias voltage Vdc in the present embodiment, a two- or more dimensional interpolation process or general approximate formula techniques may also be employed therefor.

Second Embodiment

Figure 10:
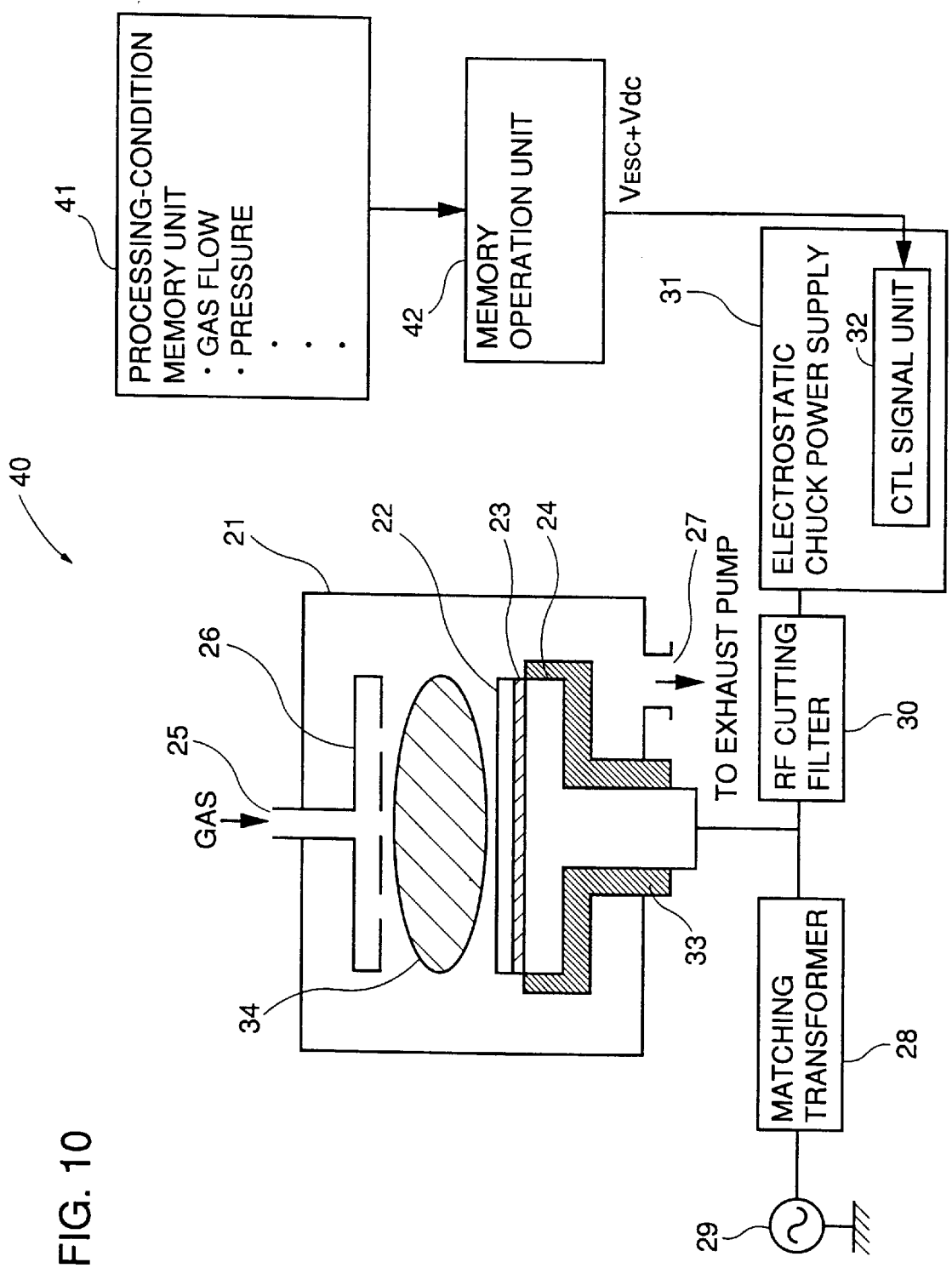
FIG. 10 is a block diagram showing a configuration of a plasma processing apparatus according to a second embodiment of the present invention.

Referring FIG. 10, a plasma processing apparatus 40 according to a second embodiment is almost similar in configuration to the FIG. 5 plasma processing apparatus 20 according to the first embodiment. The portions differing between them will now be described and a description of the remaining portions will not be repeated.

Plasma processing apparatus 40 employs a processing-condition memory unit 41 and a memory operation unit 42 in place of processing-condition memory unit 35 and memory operation unit 36 of plasma processing apparatus 20.

Processing-condition memory unit 41 stores processing conditions, such as gas flow, the pressure inside vacuum chamber 21, the magnitude of high-frequency electric power and the like, as the conditions for producing plasma 34 as desired. That is, processing-condition memory unit 41 does not store actual attract and hold voltage VESC stored in processing-condition memory unit 35.

Memory operation unit 42 determines the magnitude of the voltage applied from electrostatic chuck power supply 32 to lower electrode 42 depending on the processing conditions.

Figure 11:
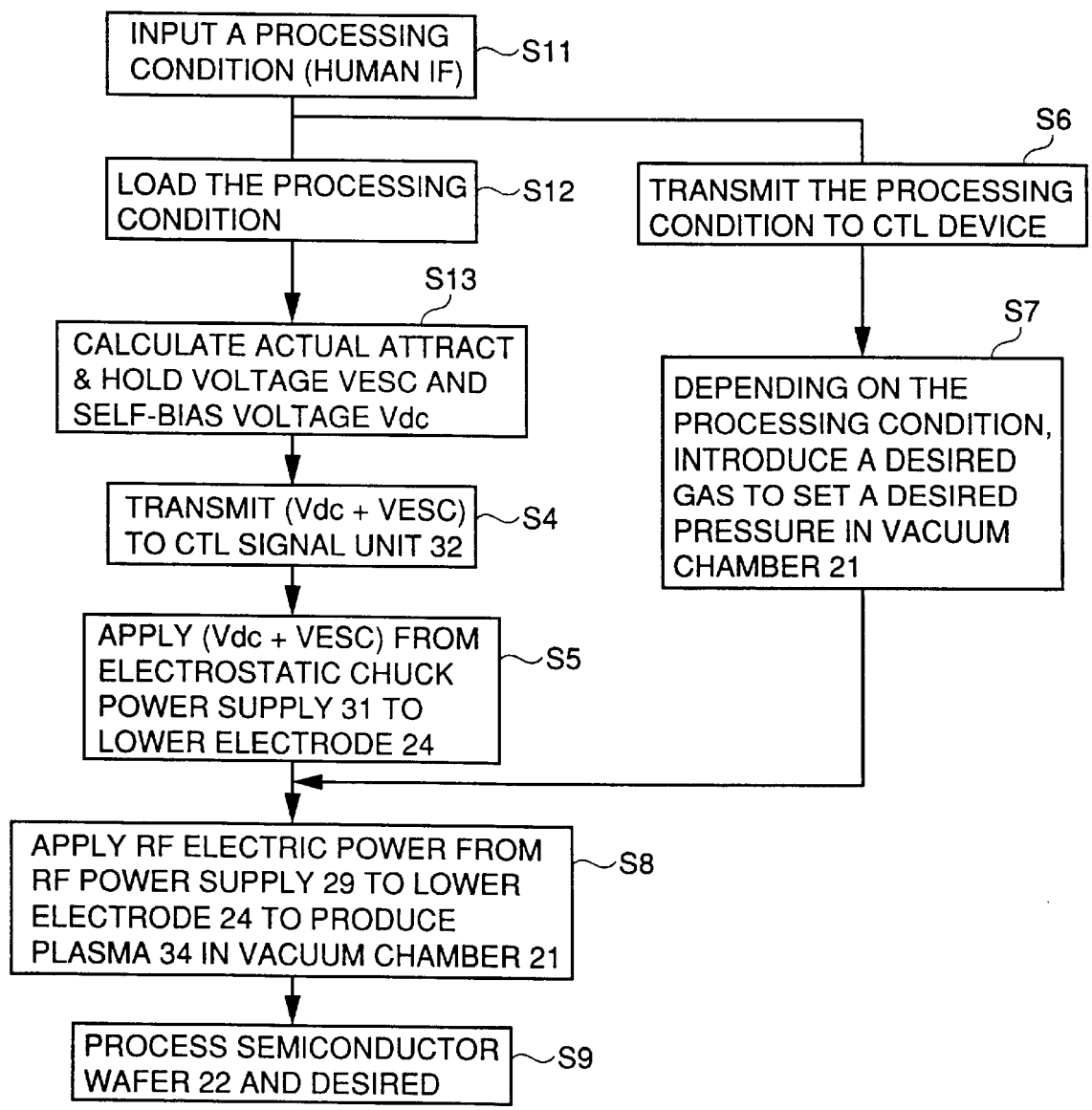
FIG. 11 is a flow chart representing an operation of the plasma processing apparatus according to the second embodiment.

Referring FIG. 11, the various portions of plasma processing apparatus 40 operate as described below. The user inputs a processing condition via an input portion (not shown) (S11). The input processing condition is stored in processing-condition memory unit 41. The processing condition stored in processing-condition memory unit 41 is transmitted to a control unit (not shown) of vacuum chamber 21 (S6). Depending on the processing condition, the control device introduces a desired gas into vacuum chamber 21 and sets a desired pressure in vacuum chamber 21 (S7).

In parallel with the S6 and S7 steps, the S12 to S13 and S4 to S5 steps are provided as described below. Memory operation unit 42 are loaded with a processing condition stored in processing-condition memory unit 41(S12). Memory operation unit 42 compares the loaded process condition with the internal data stored therein and calculates self-bias voltage Vdc and actual attract and hold voltage VESC that are generated at semiconductor wafer 22 (S13). The process for calculating self-bias voltage Vdc and actual attract and hold voltage VESC will be described hereinafter. Memory operation unit 42 adds self-bias voltage Vdc and actual attract and hold voltage VESC together and transmits the obtained value to control signal unit 32 provided in electrostatic chuck power supply 31 (S4). According to an instruction from control signal unit 32, electrostatic chuck power supply 31 applies the voltage corresponding to a value of (Vdc+VESC) to lower electrode 24 (S5). As with plasma processing apparatus 40 according to the first embodiment, the process provided so far allows semiconductor wafer 22 to be attracted and held on dielectric film 23.

Then, high-frequency power supply 29 applies high-frequency electric power to lower electrode 24. Thus, plasma 34 is produced in vacuum chamber 21 (S8). Then, semiconductor wafer 22 is processed as desired to form a semiconductor device on semiconductor wafer 22 (S9).

Figure 12:
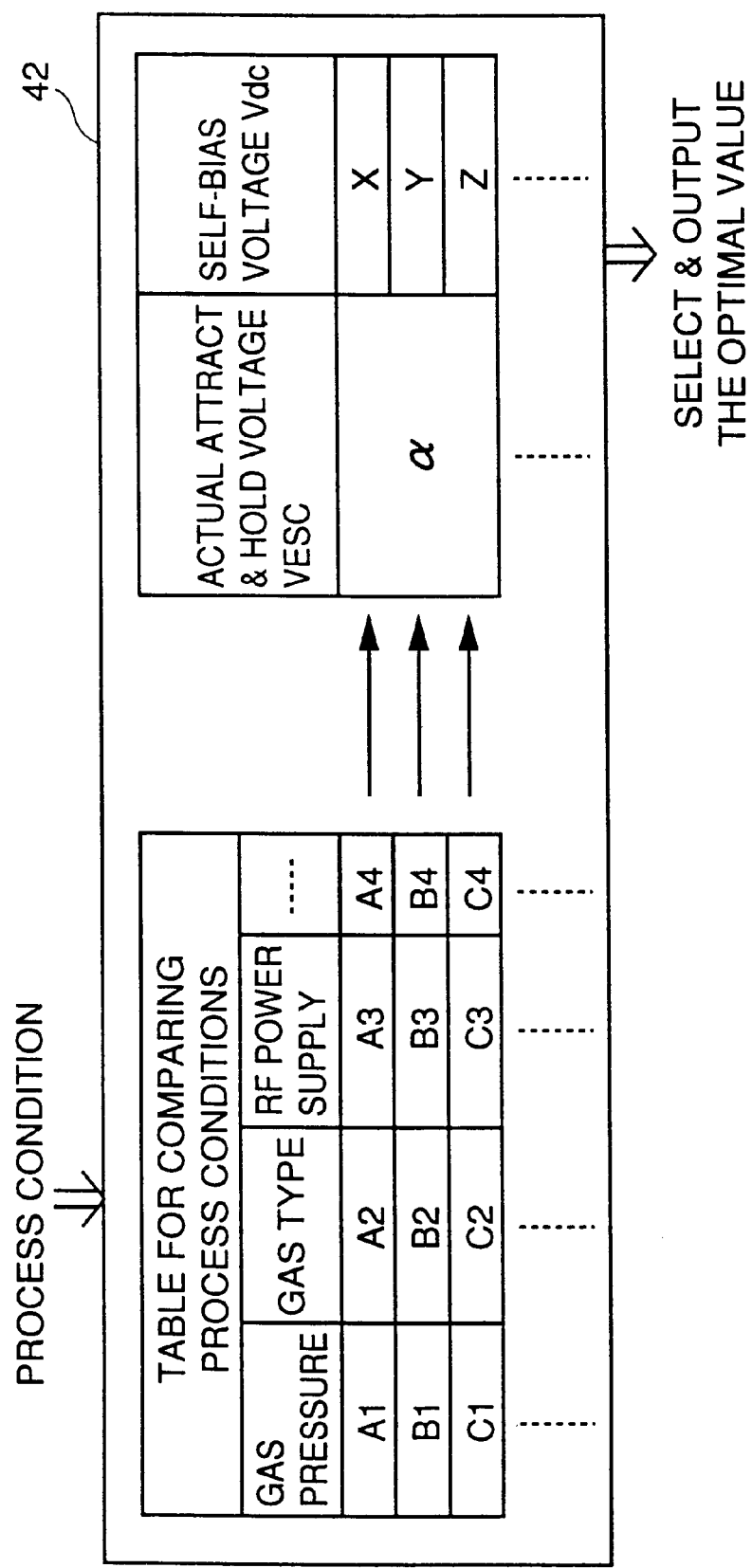
FIG. 12 represents a process for obtaining actual attract and hold voltage VESC and self-bias voltage Vdc.

Referring to FIG. 12, the S13 step in FIG. 11, i.e. how memory operation unit 42 calculates actual attract and hold voltage VESC and self-bias voltage Vdc, will now be described more specifically.

Memory operation unit 42 stores such a table for comparing processing conditions as shown in FIG. 8. The table represents a relation between processing conditions, and actual attract and hold voltage VESC and self-bias voltage Vdc that has been obtained experimentally.

For example, when gas pressure, gas type and high-frequency electric power are provided as processing condition A1, A2 and A3, respectively, these values are compared with the values presented in the table for a comparing processing conditions. The value of actual attract and hold voltage VESC is obtained as α and the value of self-bias voltage Vdc is obtained as X.

If the respective values of actual attract and hold voltage VESC and self-bias voltage Vdc corresponding to a processing condition are not stored in the table for comparing processing conditions, a process is provided as described below. That is, memory operation unit 42 applies two processing conditions closest to the processing condition and the corresponding values of actual attract and hold voltage VESC and the corresponding values of self-bias voltage Vdc to provide the linear interpolation process and thus calculate self-bias voltage Vdc. The linear interpolation process applied here is similar to that described with reference to FIG. 9 and a description thereof will not be repeated.

Thus, plasma process apparatus 40 according to the second embodiment applies the voltage corresponding to the summation of the values of actual attract and hold voltage VESC and self-bias voltage Vdc determined by a processing condition to the lower electrode. Thus the magnitude of the voltage thus generated between dielectric film 23 and semiconductor wafer 22 is equal to the value of actual attract and hold voltage VESC. Thus, semiconductor wafer 22 can be attracted and held reliably on the dielectric film 23.

Since the values of actual attract and hold voltage VESC and self-bias voltage Vdc are stored previously, processing conditions are only required to be input from the external.

Third Embodiment

Figure 13:
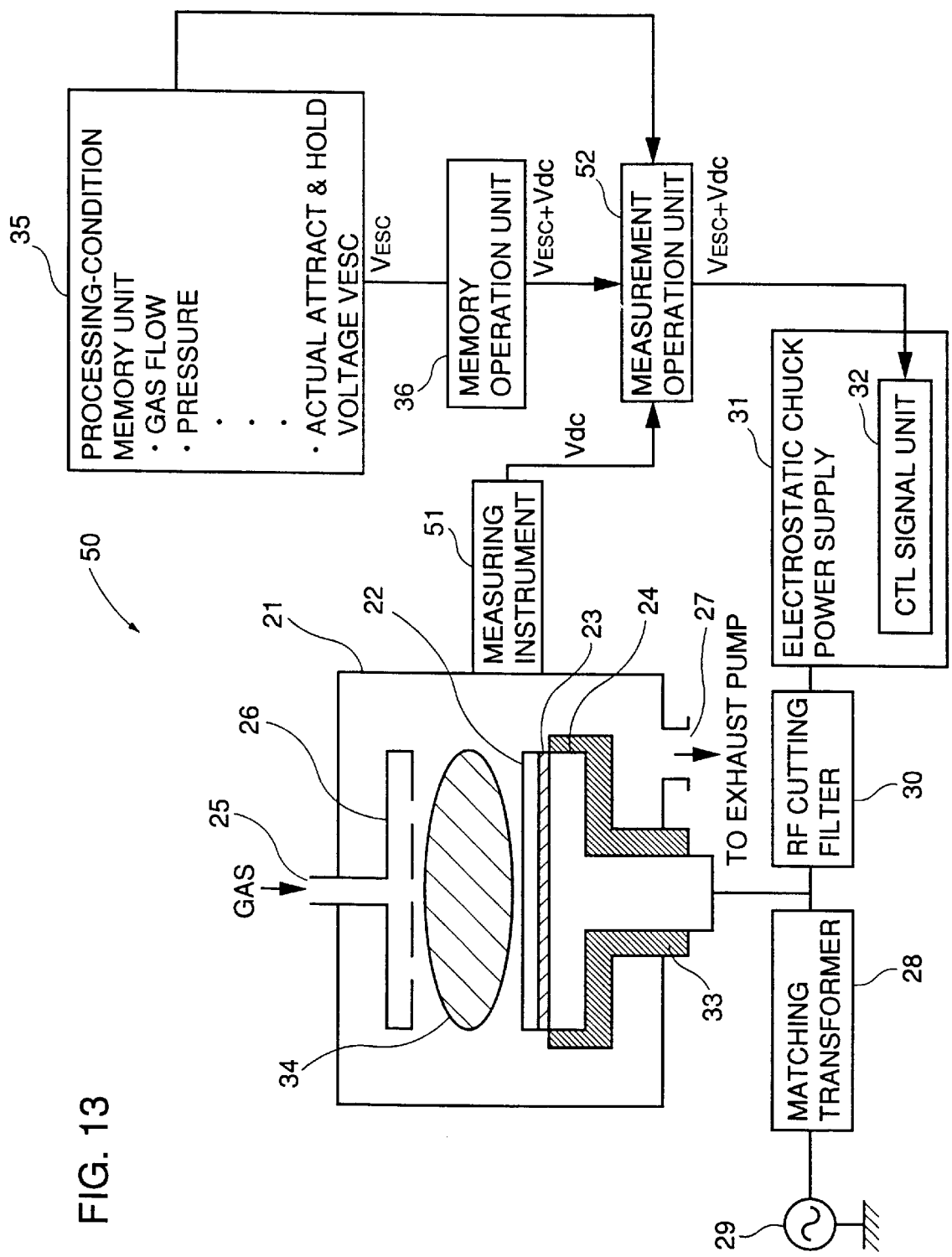
FIG. 13 shows a configuration of a plasma processing apparatus according to a third embodiment of the present invention.

Referring FIG. 13, a plasma processing apparatus 50 according to a third embodiment has the configuration of FIG. 5 plasma processing apparatus 20 according to the first embodiment plus a measuring instrument 51 and a measurement operation unit 52. The different portions will now be described and a description of the remaining portions will not be repeated.

Measuring instrument 51 is provided at vacuum chamber 21 to measure self-bias voltage Vdc generated at semiconductor wafer 22. Measuring instrument 51 is provided in the form of an electrostatic probe, a high-pressure probe, a device which observes the light-emission intensify of plasma 34, or the like.

Measurement operation unit 52 is connected to processing-condition unit 35, memory operation unit 36 and measuring Instrument 51 and determines whether self-bias voltage Vdc measured with measuring instrument 51 has a stable value. If any unstable condition of plasma 34 caused in starting a process, changing a processing condition or the like results in self-bias voltage Vdc having an unstable value, measurement operation unit 52 outputs the value corresponding to the summation of the actual attract and hold voltage VESC and self-bias voltage Vdc output from memory operation unit 36. If the self-bias voltage Vdc is otherwise stable, measurement operation unit 52 outputs the value corresponding to the summation of actual attract and hold voltage VESC stored in processing-condition memory unit 35 and self-bias voltage Vdc obtained from measuring instrument 51. Control signal unit 32 receives the value output from measurement operation unit 52 and electrostatic chuck power supply 31 thus controls the voltage applied to lower electrode 24.

Figure 14:
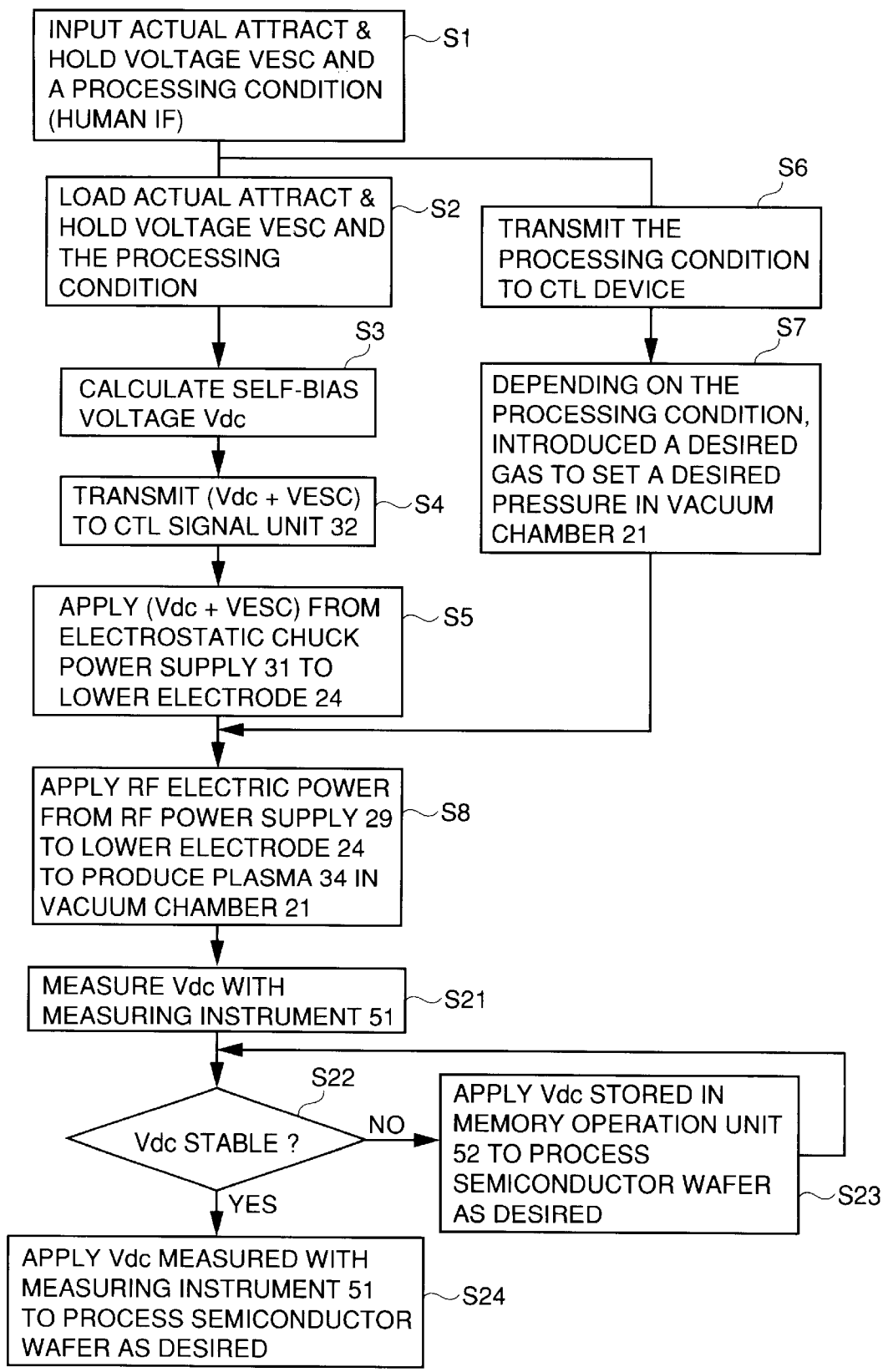
FIG. 14 is a flow chart representing an operation of the plasma processing apparatus according to the third embodiment.

Referring to FIG. 14, the various portions of plasma processing apparatus 50 operate as described below. The S1–S8 steps are similar to those effected in the FIG. 6 plasma processing apparatus 20 according to the first embodiment and the description thereof will not be repeated.

Then, measuring instrument 51 measures self-bias voltage Vdc (S21). Measurement operation unit 52 determines whether self-bias voltage Vdc is stable (S22). This steps will be described hereinafter. If measurement operation unit 52 determines that self-bias voltage Vdc is not stable (NO at S22), measurement operation unit 52 outputs a value obtained through calculation in memory operation unit 36. Electrostatic chuck power supply 31 applies the voltage corresponding to the value output from measurement operation unit 52, i.e. (VESC+Vdc), to lower electrode 24. Then, semiconductor wafer 22 is processed as desired (S23). When the S23 step completes, the control returns to S22 and measurement operation unit 52 again determines whether self-bias voltage Vdc is stabilized.

If measurement operation unit 52 determines that self-bias voltage Vdc is stabilized (YES at S22), measuring instrument 51 outputs the value corresponding to actual attract and hold voltage VESC stores in processing-condition memory unit 35 plus self-bias voltage Vdc obtained from measuring instrument 51. Electrostatic chuck power supply 31 applies the voltage corresponding to the value output from measurement operation unit 52, i.e. VESC+Vdc, to lower electrode 24. Then, semiconductor wafer 22 is processed as desired (S24).

Figure 15:
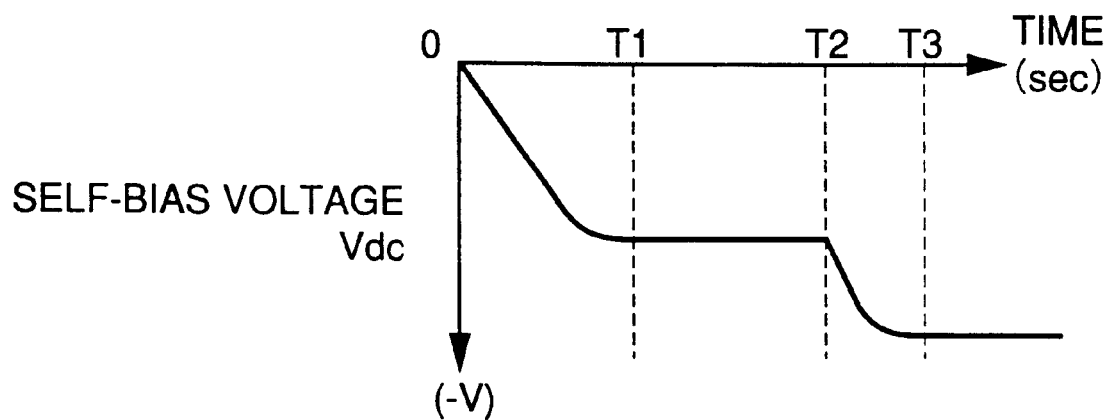
FIG. 15 represents self-bias voltage Vdc varying with time.

Referring to FIG. 15, the S22 step will now be described more specifically. FIG. 15 represents self-bias voltage Vdc varying with time. It is assumed that a processing condition is input at time 0 and the processing condition is changed at time T2. The condition of plasma 34 is unstable from time 0 through time T1 and from time T2 through time T3. Thus the value of self-bias voltage Vdc also varies. When the condition of plasma 34 is stabilized, self-bias voltage Vdc has a constant value. Thus, measurement operation unit 52 determines that self-bias voltage Vdc is stabilized if the value of self-bias voltage Vdc is constant during a determined period prior to the present. For example, measurement operation unit 52 may be adapted to determine that self-bias voltage Vdc is stabilized if the difference between the maximum value and minimum value of self-bias voltage Vdc does not exceed a predetermine value during the predetermine period. Measurement operation unit 52 may also be adapted to determine that self-bias voltage Vdc is stabilized if the inclination of the graph does not exceed a predetermine value, with the horizontal axis representing time and the vertical axis representing self-bias voltage Vdc.

Thus, for plasma processing apparatus 50 according to the third embodiment, measuring instrument 51 is employed to measure self-bias voltage Vdc generated at semiconductor wafer 22. If the self-bias voltage Vdc is unstable, plasma processing apparatus 50 applies the voltage corresponding to the summation of the value of actual attract and hold voltage VESC and that of self-bias voltage Vdc output from memory operation unit 36 to lower electrode 24. If self-bias voltage Vdc is stable, plasma processing apparatus 50 applies the voltage corresponding to the summation of the value of self-bias voltage Vdc actually measured by means of measuring instrument 51 and the value of actual attract and hold voltage VESC stored in processing-condition memory unit 35 to lower electrode 24. Thus, the voltage generated between dielectric film 23 and semiconductor wafer 22 has the same value that actual attract and hold voltage VESC has. Thus, semiconductor wafer 22 is reliably attracted and thus held on dielectric film 23. If the value of self-bias voltage Vdc is stable, the value of self-bias voltage Vdc actually measured is used to precisely attract and thus hold semiconductor wafer 22 on directive film 23.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing apparatus comprising:

external-atmosphere block means blocking an external atmosphere from an interior thereof for maintaining an atmosphere therein;

an electrode arranged in said external-atmosphere block means;

a dielectric film formed on a surface of said electrode;

gas introduction means for introducing a desired gas into said external-atmosphere block means;

plasma production means for changing said gas into a plasma;

voltage value calculation means for calculating, depending on a processing condition for producing a desired plasma, a voltage value corresponding to a sum of a value of a minimal actual attract and hold voltage required to be applied between one surface of a semiconductor wafer mounted on said dielectric film and a surface of said dielectric film to attract and hold one surface of the semiconductor wafer on the surface of said dielectric film and a value of a self-bias voltage generated at the other surface of the semiconductor wafer when the desired plasma is produced; and attract-and-hold voltage generation means for applying a voltage of the voltage value calculated by said voltage value calculation means to said electrode.

2. The plasma processing apparatus according to claim 1, wherein said voltage value calculation means includes means for storing a relation between said processing condition and the value of said self-bias voltage, receiving said processing condition and the value of said actual attract-and-hold voltage from respective externals, calculating a value of said self-bias voltage from said processing condition externally input, adding the value of said self-bias voltage obtained from the externally input said processing condition to the value of said actual attract-and-hold voltage.

3. The plasma processing apparatus according to claim 1, wherein said voltage value calculation means includes means for storing a relation between said processing condition and the value of said self-bias voltage and the value of said actual attract-and-hold voltage, receiving said processing condition externally, obtaining the value of said self-bias voltage and the value of said actual attract and hold voltage from said processing condition externally input for summation thereof.

4. The plasma processing apparatus according to claim 1, further comprising measuring means for measuring said self-bias voltage, wherein said voltage value calculation means includes:

determination means connected to said measuring means for determining whether a value of said self-bias voltage is stable;

storage means for storing a relation between said processing condition and the value of said self-bias voltage; and means connected to said measuring means, said determination means and said storage means, in accordance with an output from said determination means for selecting one of said self-bias voltage determined by said processing condition and said self-bias voltage measured with said measuring means and adding a selected said self-bias voltage to one of said actual attract and hold voltage input externally and said actual attract and hold voltage stored in said storage means.

5. The plasma processing apparatus according to claim 4, wherein said determination means determines that said self-bias voltage is stable when a difference between a maximal value and minimal value of said self-bias voltage does not exceed a predetermined value during a predetermined period of time prior to a present and said determination means determines that said self-bias voltage is not stable when the difference between the maximal value and minimal value of said self-bias voltage exceeds said predetermined value during said predetermined period of time prior to the present.

6. A plasma processing apparatus comprising:

a vacuum chamber having a gas supply port opening therein to;

an electrode arranged in said vacuum chamber;

a dielectric film formed on a surface of said electrode;

a high-frequency power supply connected to said electrode;

a memory operation unit for calculating, depending on a processing condition for producing a desired plasma, a voltage value corresponding to a sum of a value of a minimal actual attract and hold voltage required to be applied between one surface of a semiconductor wafer mounted on said dielectric film and a surface of said dielectric film to attract and hold one surface of the semiconductor wafer on the surface of said dielectric film and a value of a self-bias voltage generated at the other surface of the semiconductor wafer when the desired plasma produced; and an electrostatic chuck power supply for applying a voltage corresponding to the voltage value calculated in said memory operation unit to said electrode.

7. The plasma processing apparatus according to claim 6, wherein said memory operation unit includes means for storing a relation between said processing condition and the value of said self-bias voltage, receiving said processing condition and the value of said actual attract and hold voltage from respective externals, obtaining a value of said self-bias voltage from the externally input said processing condition, and adding the value of said self-bias voltage obtained from the externally input said processing condition to the value of said actual attract and hold voltage.

8. The plasma processing apparatus according to claim 6, wherein said memory operation unit includes means for storing a relation between said processing condition and the value of said self-bias voltage and the value of said actual attract and hold voltage, receiving said processing condition externally, and obtaining a value of said self-bias voltage and a value of said actual attract and hold voltage from the externally input said processing condition for summation thereof.

9. The plasma processing apparatus according to claim 6, further comprising a measuring instrument for measuring said self-bias voltage, wherein said memory operation unit includes:

determination means connected to said measuring instrument for determining whether a value of said self-bias voltage is stable;

a storage device for storing a relation between said processing condition and the value of said self-bias voltage; and means connected to said measuring instrument, said determination means and said storage device, in accordance with an output from said determination means for selecting one of said self-bias voltage determined by said processing condition and said self-bias voltage measured with said measuring instrument and adding a selected said self-bias voltage to one of said actual attract and hold voltage input externally and said actual attract and hold voltage stored in said storage device.

10. The plasma processing apparatus according to claim 9, wherein said determination means determines that said self-bias voltage is stable when a difference between a maximal value and minimal value of said self-bias voltage does not exceed a predetermined value during a predetermined period of time prior to a present and said determination means determines that said self-bias voltage is not stable when the difference between the maximal value and minimal value of said self-bias voltage exceeds said predetermined value during said predetermined period of time prior to the present.

* * * * *